(12) United States Patent
Bohler (10) Patent No.: US 9,360,171 B2
(45) Date of Patent: Jun. 7, 2016

(54) FLEXIBLE SUBSTRATE LIGHTING FIXTURES

(71) Applicant: Christopher Lee Bohler, Peachtree City, GA (US)

(72) Inventor: Christopher Lee Bohler, Peachtree City, GA (US)

(73) Assignee: Cooper Technologies Company, Houston, TX (US)

( * ) Notice: Subject to any disclaimer, the term of this patent is extended or adjusted under 35 U.S.C. 154(b) by 148 days.

(21) Appl. No.: 14/199,890

(22) Filed: Mar. 6, 2014

(65) Prior Publication Data

US 2014/0254152 A1    Sep. 11, 2014

Related U.S. Application Data

(60) Provisional application No. 61/773,436, filed on Mar. 6, 2013.

(51) Int. Cl.
| | |
|---|---|
| *F21K 99/00* | (2016.01) |
| *F21V 3/04* | (2006.01) |
| *F21V 9/08* | (2006.01) |
| *F21Y 101/02* | (2006.01) |
| *H05K 1/18* | (2006.01) |
| *F21Y 105/00* | (2016.01) |

(52) U.S. Cl.
CPC ............... *F21K 9/50* (2013.01); *F21V 3/0409* (2013.01); *F21K 9/17* (2013.01); *F21K 9/90* (2013.01); *F21V 9/08* (2013.01); *F21Y 2101/02* (2013.01); *F21Y 2105/003* (2013.01); *H05K 1/189* (2013.01); *H05K 2201/10106* (2013.01)

(58) Field of Classification Search
CPC .................................. F21K 9/50; F21V 3/0409
See application file for complete search history.

(56) References Cited

U.S. PATENT DOCUMENTS

| | | | |
|---|---|---|---|
| 2004/0032727 A1 | 2/2004 | Cok | |
| 2004/0160166 A1 | 8/2004 | Cok | |
| 2011/0298371 A1* | 12/2011 | Brandes | ................ F21K 9/135 315/32 |
| 2013/0026513 A1 | 1/2013 | Aurongzeb et al. | |

FOREIGN PATENT DOCUMENTS

RU          2207635          6/2003

OTHER PUBLICATIONS

International Search Report for PCT/US2014/021400, mailed Jun. 26, 2014.

* cited by examiner

*Primary Examiner* — Mary Ellen Bowman
(74) *Attorney, Agent, or Firm* — King & Spalding LLP (57) ABSTRACT

A lighting fixture can comprise a flexible substrate and an array of light emitting diodes (LEDs) coupled to the flexible substrate. In various embodiments, the array of LEDs can be disposed at one region of the flexible substrate, with another area of the flexible substrate free from LEDs. Light emitted from the LED array can be incident upon the area that is free from LEDs, and that area can manage the incident light to achieve a desired effect. Accordingly, the flexible substrate can filter, diffuse, refract, transmit, diffract, imprint information upon, or otherwise purposely manipulate light generated by associated LEDs The flexible substrate may be manipulated into different forms for different lighting fixtures styles and models and for different applications.

19 Claims, 6 Drawing Sheets

FLEXIBLE SUBSTRATE LIGHTING FIXTURES

CROSS REFERENCE TO RELATED APPLICATIONS

This application claims priority to U.S. Provisional Patent Application No. 61/773,436 filed Mar. 6, 2013 in the name of Christopher Lee Bohler and entitled "Flexible Substrate Lighting Fixtures," the entire contents of which are hereby incorporated herein by reference.

TECHNICAL FIELD

Embodiments described herein generally relate to lightings systems and, more particularly, to various solutions utilizing flexible substrates for light source mounting.

BACKGROUND

Interest in adoption of light emitting diode (LED) light sources is escalating, as light emitting diodes offer advantages over incandescent lighting and other approaches to converting electrical energy into luminous energy. Such advantages include longevity and efficiency. Light emitting diodes typically come in packages that are very different from conventional incandescent light bulbs or fluorescent bulbs. Additionally, light emitting diodes emit light in a very different geometry than most other conventional illumination sources.

New manufacturing and assembly technologies are needed to leverage fully the advantages and unique physical, optical, and electrical characteristics of light emitting diodes. New solutions for managing and controlling light produced by light emitting diodes are needed. Need exists for lighting fixtures that incorporate light emitting diodes in a manner that increases adaptability in lighting fixture design and format, and that may support better economics and/or lower cost as compared to conventional lighting fixtures. Need also exists for improved substrates for mounting light emitting diodes. Further need exists for light emitting diode based lighting fixtures that have a higher degree of integration.

A capability addressing one or more such needs, or some other related deficiency in the art, would support improved illumination systems and wider use of light emitting diodes.

SUMMARY

A lighting fixture can comprise a substrate with an array of light emitting diodes disposed along the substrate. The substrate can be flexible and manipulated so that light produced from the light emitting diodes is incident upon the substrate. The produced light may be incident upon an area of the substrate that manages the incident light. The substrate may diffuse, refract, diffract, reflect, transmit, filter, imprint information upon, pattern, form text or images from, or otherwise purposely manipulate the incident light to achieve a desired effect.

The foregoing discussion of lighting fixtures is for illustrative purposes only. Various aspects of the present technology may be more clearly understood and appreciated from a review of the following text and by reference to the associated drawings and the claims that follow. Other aspects, systems, methods, features, advantages, and objects of the present technology will become apparent to one with skill in the art upon examination of the following drawings and text. It is intended that all such aspects, systems, methods, features, advantages, and objects are to be included within this description and covered by this application and by the appended claims of the application.

BRIEF DESCRIPTION OF THE FIGURES

Reference will now be made to the accompanying drawings, which are not necessarily drawn to scale, and wherein.

The drawings illustrate only example embodiments and are therefore not to be considered limiting of the embodiments described, as other equally effective embodiments are within the scope and spirit of this disclosure. The elements and features shown in the drawings are not necessarily drawn to scale, emphasis instead being placed upon clearly illustrating the principles of the embodiments. Additionally, certain dimensions or positionings may be exaggerated to help visually convey certain principles. In the drawings, similar reference numerals among different figures designate like or corresponding, but not necessarily identical, elements.

DETAILED DESCRIPTION OF EXAMPLE EMBODIMENTS

One or more light emitting diodes can be mounted to a region of a substrate so that emitted light is incident upon a second region of the substrate. The second region of the substrate can manipulate the incident light, resulting in illumination characteristics adapted for one or more lighting applications. Accordingly, the substrate can not only structurally support a light emitting diode, but also manage emitted light. In some embodiments, the substrate may be flexible to facilitate manipulating the substrate into a desired geometry. In other words, the manipulated flexible substrate can be adapted or changed to suit a particular application or purpose. The lighting applications served may involve signage, emergency lighting, overhead lighting, outdoor lighting, street lighting, garage lighting, luminaires, lighting fixtures, wall-mounted lighting, and recessed lighting, to mention a few representative examples without limitation.

Embodiments of the disclosure will be described more fully hereinafter with reference to the accompanying drawings, in which some example embodiments of the disclosure are illustrated. This disclosure may, however, encompass or be embodied in many different forms and should not be construed as limited to the embodiments set forth herein; rather, these embodiments are provided so that this disclosure will be thorough and complete, and will fully convey the scope of the disclosure to those appropriately skilled in the art.

Figure 1:
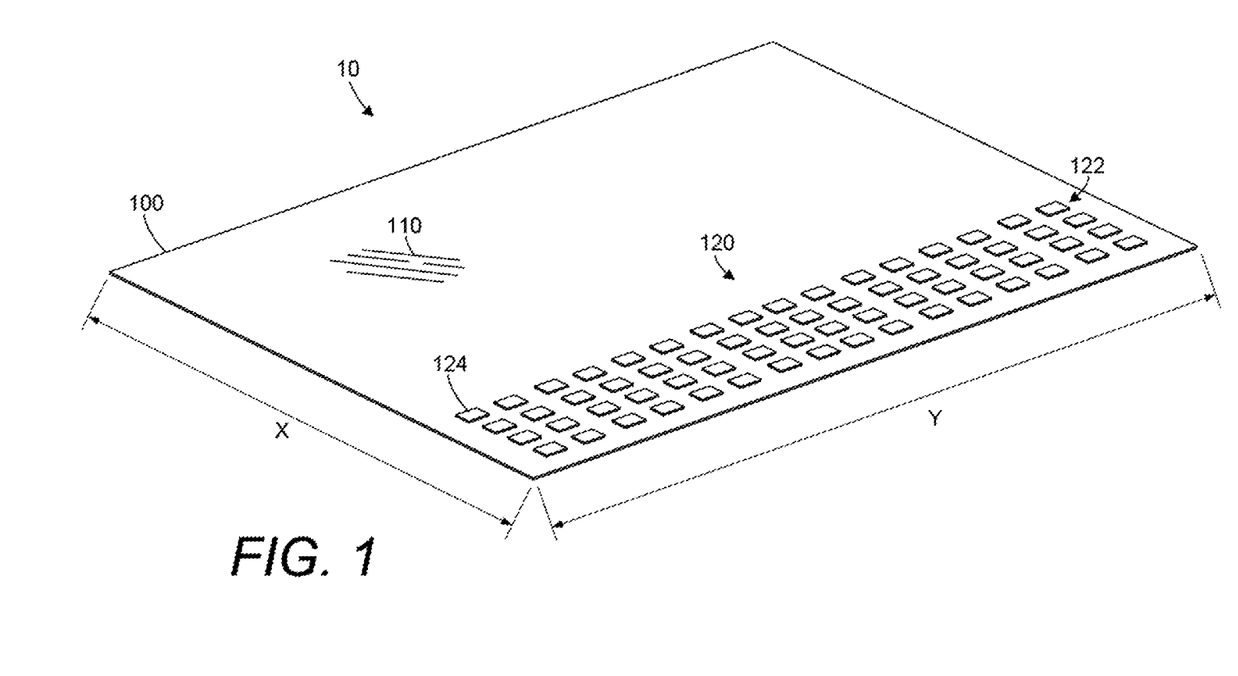
FIG. 1 is a perspective view of a flexible substrate array according to an example embodiment.

Turning now to FIG. 1, this figure provides a perspective view of a flexible substrate array 10 according to an example embodiment. As illustrated, the flexible substrate array 10 includes a substrate 100 and a light emitting diode array 120 positioned within an array area of the substrate 100.

The term "flexible," as used herein in the context of describing a material property, generally describes something as capable of being bent without breaking Accordingly, in an example embodiment, the flexible substrate array 10 is capable of being bent without breaking.

The term "array," as used herein generally refers to an order or arrangement. An array may comprise two or more things arranged in a pattern, for example. An array of objects may be arranged in one or more rows, columns, or a lines, for example. An array of objects may be arranged in a spiral or other nonlinear pattern. An array of objects may further be arranged in locations that are defined using random number generation, so that there may be at least some degree of inadvertent or deliberate randomness associated with the positioning, for example.

The term "light emitting diode array" or "LED array," as used herein, generally refers to an array of light emitting diodes (LEDs).

In some example embodiments, the substrate 100 of the flexible substrate array 10 may be elastic so that the flexible substrate array 10 is capable of returning to its original form after being bent, stretched, deformed, compressed, or expanded. The substrate 100 of the flexible substrate array 10 may comprise an elastomeric material, for example.

In some example embodiments, the flexible substrate array 10 may be bent or otherwise deformed so that the flexible substrate array 10 is permanently bent or deformed. In such an embodiment, the flexible substrate array 10 may be bent by exerting a bending force upon the flexible substrate array 10, with the flexible substrate array 10 remaining at least partially bent after the bending force is released, for example.

In some example embodiments, the substrate 100 comprises an organic polymer, plastic, or other suitable flexible material and may include certain reinforcements, fibers, and/or pigments, for example, in various embodiments.

In some example embodiments, the substrate 100 is transparent or semi-transparent. In some example embodiments, the substrate 100 is formed with pigments or dyes to add color to the substrate 100. The added color or dye can optically filter incident light emitted by the light emitting diode array 120, for example causing a white light produced by the light emitting diode array 120 to take on a red hue by filtering out light colors other than red. In some example embodiments, the substrate 100 comprises a scattering agent that diffuses incident light produced by the light emitting diode array 120.

In some example embodiments, the substrate 100 is substantially homogeneous. In some example embodiments, different areas of the substrate 100 have different optical, electrical, chemical, physical, and/or mechanical properties. In some example embodiments, the substrate 100 may comprise multiple layers made of different materials, for example. The substrate 100 may comprise a laminate, for example.

In an example embodiment, the substrate 100 is generally flexible, relatively thin, and may range in thickness from about 0.1 mm to about 1.5 mm, for example. Various applications may benefit from having a lesser or a greater thickness.

The substrate 100 may be cut to any suitable dimension in width "X" and length "Y," without limitation. Although the substrate 100 is illustrated in FIG. 1 as being rectangular in shape, it should be appreciated that the substrate 100 may be cut into any shape having one or more straight and/or curved sides from a larger sheet of substrate material. The substrate 100 may be circular, triangular, oval, square, hexagonal, or some other appropriate form, to mention a few representative examples without limitation.

In the illustrated embodiment of FIG. 1, the substrate 100 is flat in a relaxed state. Other embodiments may be domed, shaped, or contoured to provide a three-dimensional form in a relaxed state, for example.

Electrical traces comprising conductive or semi-conductive material suitable for the application, for example metal or metal alloys, may be applied to the substrate 100 to electrically couple light emitting diodes 124 and other electrical components or elements to power, as discussed in further detail below. Such materials may be printed or sputtered onto the substrate 100, for example.

As illustrated in FIG. 1, the light emitting diode array 120 may be positioned in one area of the substrate 100 and the remaining area of the substrate 100 may remain open or free from electrical traces and electrical elements to provide an optic area 110. The term "optic area," as used herein, generally refers to an area that transmits, reflects, or purposely manipulates light that is intentionally incident on the area.

In the illustrated example embodiment, the optic area 110 comprises an area of the substrate 100 that is free from the light emitting diode array 120. In the illustrated example embodiment, the optic area 110 is displaced from the light emitting diode array 120. In some embodiments, the optic area 110 may substantially adjoin the light emitting diode array 120. In some example embodiments, one or more light emitting diodes may be within an optic area.

In one example embodiment, the substrate 100 can be one continuous piece of material comprising an optic area 110 and another area on which the light emitting diode array 120 can be positioned.

In some example embodiments, the optic area 110 of the substrate 100 is free from electrical traces, light emitting diodes, and other discrete components and may be stamped, molded, or embossed to form a diffuser. Such a diffuser can diffuse light produced by the light emitting diode array 120 that is incident upon the optic area 110. The light may be diffused as it passes through the optic area 110 of the substrate 100, for example.

In some example embodiments, the optic area 110 may comprise optical features that refract or otherwise manipulate incident light, which may either pass through the optic area 110 or be reflected by the optic area 100, for example. Such optical features may comprise patterned surfaces, relief areas, raised areas, indentations, and other appropriate features, for example.

In some example embodiments, the optic area 110 may comprise a printed marking including text or images, without limitation. For example, the optic area 110 of the substrate 100 may include the characters "EXIT," printed using an appropriate typeface (with appropriate size, shape, and color (s)) for signage. Accordingly, the optic area 110 may imprint information upon the incident light, including graphical, icon, color, warning, or textual information, for example.

As described in further detail below, the substrate 100 may be folded, manipulated, and assembled into various configurations to produce at a lighting fixture. Markings may be printed on the substrate 100 before or after such folding/manipulation of the substrate 100 to display messages or images, for example.

The light emitting diode array 120 comprises individual light emitting diodes 124 arranged in rows 122. In various embodiments, the light emitting diode array 120 may include additional or fewer light emitting diodes 124 and rows 122 of light emitting diodes 124, as compared to the example embodiment illustrated in FIG. 1. In certain embodiments, the light emitting diode array 120 may comprise one or more rows 122 positioned at various spaced-apart locations on the substrate 100.

In some example embodiments, the flexible substrate array 10 may comprise multiple light emitting diode arrays 120 mounted to a common substrate 100. Such light emitting diode arrays 120 may be separated from one another. The flexible substrate array 10 may further comprise multiple optic areas 110. In some such embodiments, each optic area 110 may be associated with a different light emitting diode array 120, for example.

One or more optical areas 110 can occupy a fraction of the total surface area of the flexible substrate array 10. One or more light emitting diode arrays 120 can occupy another fraction of the total surface area of the flexible substrate array 10. In some example embodiments, the ratio between the optical area surface area and the LED surface area is approximately 1:1. In some example embodiments, the ratio is approximately 100:1. In some example embodiments, the ratio is 1:100. In some example embodiments, the ratio is in a range between 1:100 and 1:1. In some example embodiments, the ratio is in a range between 1:1 and 1:100.

Electrical connections among the light emitting diodes 124 of the light emitting diode array 120 can be formed on (or embedded in) the substrate 100 to provide electrical power to the light emitting diodes 124, as discussed above. In some embodiments, the light emitting diode array 120 may additionally include electrical components other than light emitting diodes, such as resistors, diodes, capacitors, or mechanical switches, for example.

It should be appreciated that the light emitting diodes 124 may comprise any known light emitting diode suitable for a particular application. In certain embodiments, the light emitting diodes 124 comprise surface mount light emitting diodes mounted to the substrate 100 at regular or irregular intervals in straight or curved lines, although other types and arrangements of light emitting diodes may be used. The light emitting diodes 124 may emit various wavelengths (i.e., colors) of light, depending upon the type of light emitting diode. Moreover, a single light emitting diode array 120 can comprise multiple types of light emitting diodes 124 and/or light emitting diodes 124 that emit different colors of light.

As described in further detail below with reference to various embodiments, assembly of the flexible substrate array 10 into certain shapes or forms may be accomplished by folding, curling, or otherwise manipulating the substrate 100. As the substrate 100 is flexible in an example embodiment, the flexible substrate array 10 may be folded or otherwise manipulated into various shapes. Additionally, as the material of the substrate 100 is transparent or semi-transparent in some embodiments, if the flexible substrate array 10 is folded into a cylinder, for example, light emitting from the light emitting diode array 120 can be diffused through the substrate 100. After diffusion, light emitting from the light emitting diode array 120 may appear more uniform, as desirable for some example applications.

Figure 2:
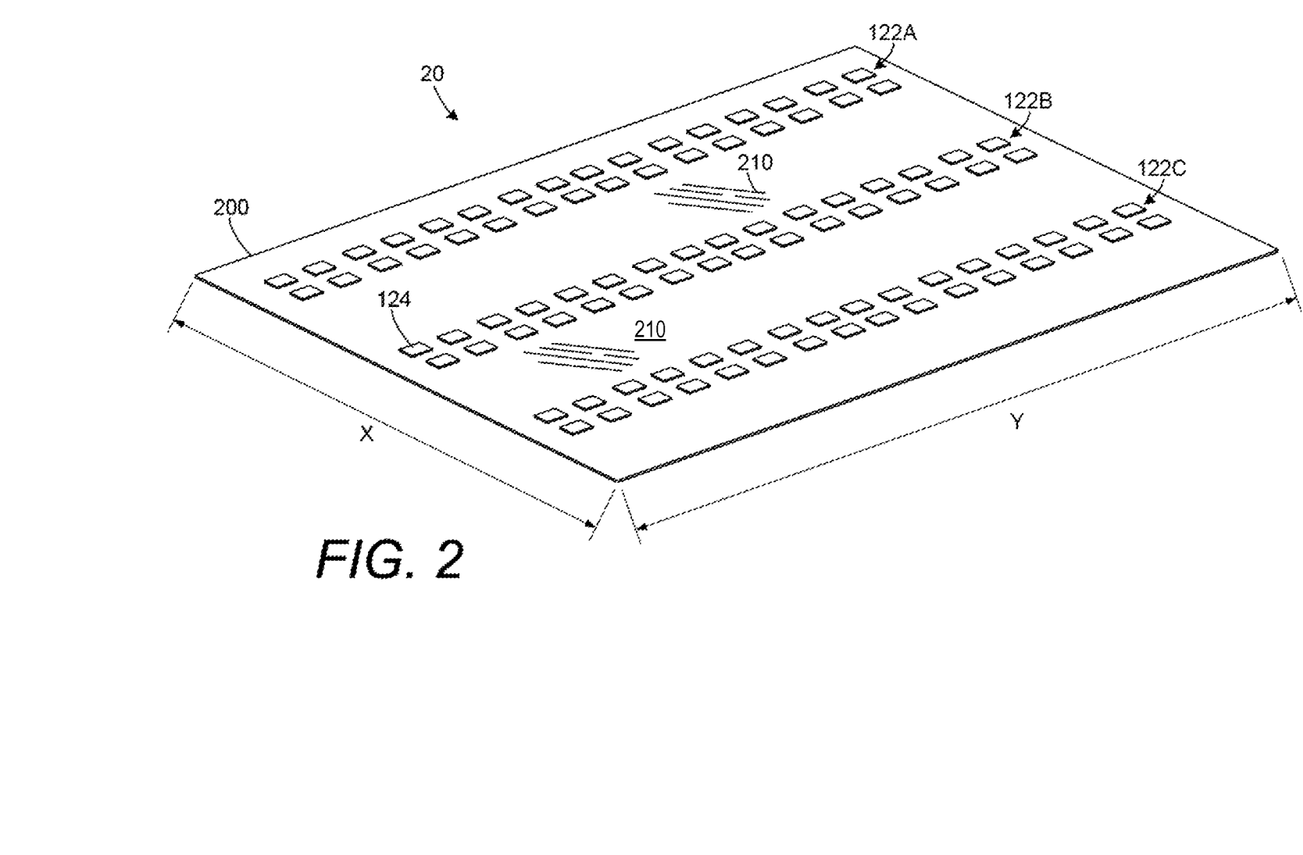
FIG. 2 is a perspective view of a flexible substrate array according to another example embodiment.

Turning now to FIG. 2, this figure provides a perspective view of a flexible substrate array 20 according to another example embodiment. As compared to the flexible substrate array 10 of FIG. 1, the example flexible substrate array 20 of FIG. 2 includes an array of light emitting diodes 124 positioned in three groups 122A, 122B, 122C of rows on the substrate 200. The three groups 122A, 122B, 122C can be viewed either as three light emitting diode arrays or collectively as one light emitting diode array. Open spaces 210 between the three groups 122A, 122B, and 122C can comprise two optic areas. Alternatively, a single optic area can comprise the two open spaces 210. Accordingly, an optic area may be either contiguous or noncontiguous.

Based on the placement of the light emitting diodes 124 on the substrate 200, when the flexible substrate array 20 is folded or manipulated, as further described below, light from the light emitting diodes 124 can disperse in a varied manner as compared to the flexible substrate array 10 of FIG. 1.

It is noted that the arrangements of the light emitting diodes 124 on the substrates 100 and 200, as illustrated in FIGS. 1 and 2, are provided by way of example only and without limitation. Various other arrangements or placements of light emitting diodes 124 are within the scope and spirit of the embodiments described herein. Moreover, the "X" and "Y" dimensions depicted on FIGS. 1 and 2 can take on numerous values as may be useful for various applications. As mentioned above with reference to FIG. 1, the substrate 200 may have a variety of geometries, and may deviate from flat, for example having a concave or convex form.

In one example embodiment, the flexible substrate array 20 extends in the X dimension without adding additional groups 122A, 122B, 122C of light emitting diodes 124. Thus, in the flexible substrate array 20 may have one area populated with light emitting diodes 124 as illustrated and another, extended area of at least the same surface area that is void of light emitting diodes 124. Such an embodiment of the flexible substrate array 20 can be utilized to produce the lighting fixture 60 illustrated in FIG. 6, as discussed in further detail below.

Figure 3:
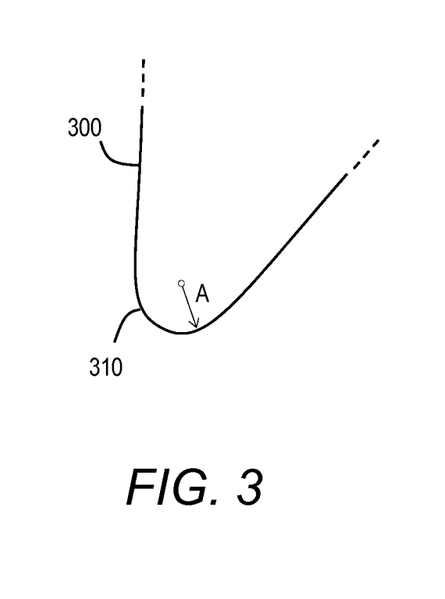
FIG. 3 is a cross-section view of a flexible substrate, illustrating an example radius of curvature.

Turning now to FIG. 3, this figure provides a cross-section view of a substrate 300 that illustrates a radius of curvature of the substrate 300 when folded or manipulated. Light emitting diodes (not illustrated in FIG. 3) may be mounted to the substrate 300 to create a folded substrate array, for example. Mounting of the light emitting diodes to the substrate 300 may occur prior to substrate folding in some example embodiments. Alternatively, substrate folding may occur prior to light emitting diode mounting in other example embodiments.

As illustrated in FIG. 3, the substrate 300 has been manipulated to form a rounded corner 310, having a radius of curvature "A." Depending upon the flexibility and thickness of the material of the substrate 300, the radius "A" may vary. In certain embodiments, the material of the substrate 300 may be selected to achieve a radius "A" as small as ¼ to ½ inch without damaging the substrate 300. In some example embodiments, the material of the substrate 300 may be selected to achieve a radius "A" up to ¾ inch, similar to a radius of a standard fluorescent T5, T8 or T12 bulb. Some applications will benefit from smaller or larger radii.

In some embodiments, the rounded corner 310 is created by applying flexing force to the substrate 300, and if the flexing force is released, the substrate 300 may relax and return to a flat state. In some embodiments, the rounded corner 310 is created by applying flexing force to the substrate 300, and if the flexing force is released, the substrate 300 retains its bent state. Thus, a deformation may be permanent or temporary.

Some example embodiments of lighting fixtures utilizing flexible array technology will now be discussed with reference to FIGS. 4A, 4B, 5, and 6, without limitation. Accordingly, these embodiments are among numerous other supported by the disclosure.

Figure 4A:
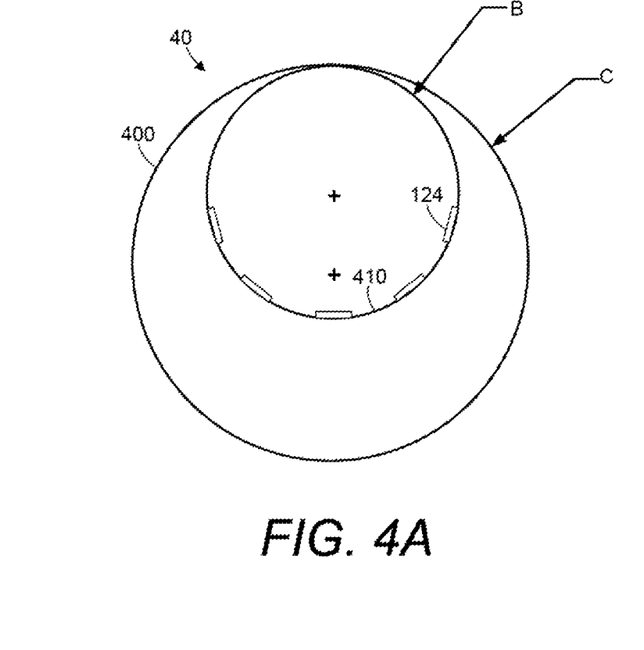
FIG. 4A is a cross-section view of a cylindrical flexible substrate lighting fixture according to an example embodiment.

Turning now to FIG. 4A, this figure provides a cross-section view of a cylindrical flexible substrate lighting fixture 40 according to an exemplary embodiment. The cylindrical flexible substrate lighting fixture 40 includes an outer tube 400 and an inner tube 410. The lighting fixture 40 may be formed from a flexible substrate array comprising a diffuser or other optical features as discussed above with reference to the flexible substrate array 10 of FIG. 1, for example. For the lighting fixture 40, it is noted that the position (and number) of the light emitting diodes 124 within the inner tube 410 is illustrated by way of example only. In other embodiments, the light emitting diodes 124 may be positioned on an outer surface or both outer and inner surfaces of the inner tube 410.

The lighting fixture 40 can be produced from the flexible substrate array 10 of FIG. 1 as follows. The flexible substrate array 10 can be manipulated by curling it to form the inner tube 410. Once the inner tube 410 is formed, further curling the remaining optic area 110 of the array 10 can form the outer tube 400. Accordingly, the inner and outer tubes 410, 400 can be formed from one continuous piece of material.

In the illustrated arrangement, light that emits from the light emitting diodes 124 is diffused by the substrate material of the inner tube 410 and also by the substrate material of the outer tube 400. As illustrated, a diameter "B" of the inner tube 410 is less than a diameter "C" of the outer tube 400. Depending upon the dimensions of the flexible substrate array 10, the lighting fixture 40 may be formed into various sizes (i.e., diameters "B" and "C") and lengths.

Production of the lighting fixture 40 from the flexible substrate array 10 can be relatively simple. Generally, the lighting fixture 40 may be assembled quickly, even by hand, without necessarily requiring specialized tools or equipment. In other cases, the lighting fixture 40 may be assembled with the assistance of appropriate tools, machines, automation, or equipment, if desirable for economic or other reasons. In certain embodiments, heat may be used to increase flexibility of the substrate 100, before curling it to form the lighting fixture 40. In some embodiment, the substrate 100 may be flexible during one stage of fixture manufacture and inflexible or rigid during another. Also, adhesives or mechanical means to secure the sides of the substrate 100 may be used to maintain the cylindrical form of the lighting fixture 40.

In some example embodiments, the lighting fixture 40 comprises a frame that supports the flexible substrate array 10. The frame may maintain the flexible substrate array 10 in a curled configuration or in some other desirable orientation, for example. In some example embodiments, the lighting fixture 40 may comprise a housing or enclosure, either of which may comprise or be associated with such a frame.

Figure 4B:
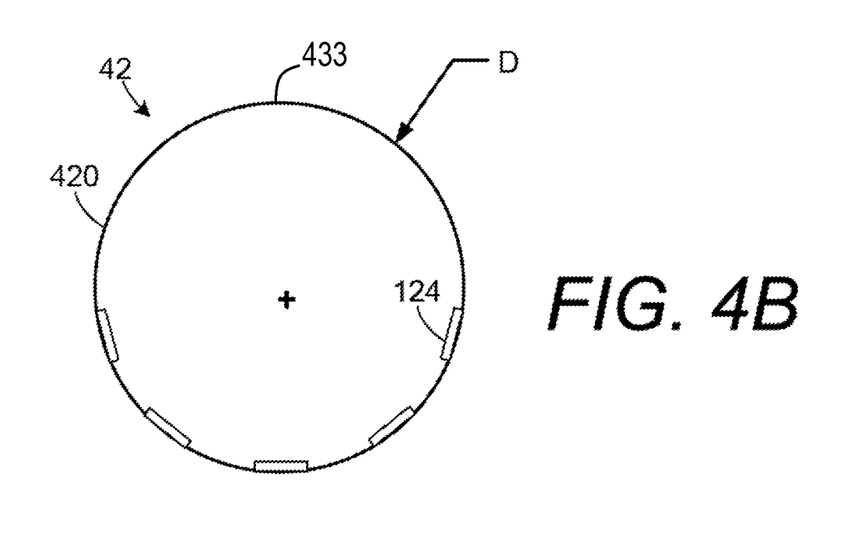
FIG. 4B is a cross-section view of a cylindrical flexible substrate lighting fixture according to another example embodiment.

Turning now to FIG. 4B, this figure provides a cross-section view of a cylindrical flexible substrate lighting fixture 42 according to another example embodiment. The cylindrical flexible substrate lighting fixture 42 is similar to the lighting fixture 40 illustrated in FIG. 4A, but is formed into a single tube 420.

The tube 420 can comprise an integral optic area 433 with features to disperse or otherwise manipulate light emitted from the light emitting diodes. To produce the lighting fixture 42, the flexible substrate array 10 that is illustrated in FIG. 1 can be manipulated by curling to form a tube 420. Once the tube 420 is formed, adhesives or mechanical fasteners can be used to secure the sides of the flexible array 10 to maintain the cylindrical form of the lighting fixture 42. In various embodiments, a diameter "D" of the diffuser 420 may vary in size. Tube length of the lighting fixture 42 may also vary, and may be set according to application specifics. In certain example embodiments, the diameter and length dimensions of the tube 420 may be selected to match industry standard dimensions for fluorescent tubes.

Figure 5:
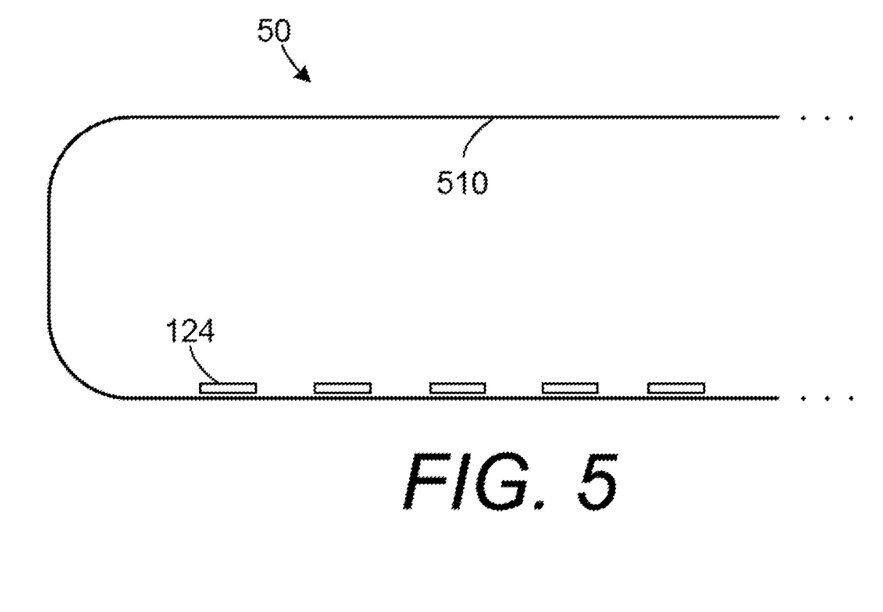
FIG. 5 is a cross-section view of a planar flexible substrate lighting fixture according to an example embodiment.

Turning now to FIG. 5, this figure provides a cross-section view of a planar flexible substrate lighting fixture 50 according to an example embodiment. The flexible substrate lighting fixture 50 can be produced from the flexible substrate array 10 illustrated in FIG. 1.

For example, the lighting fixture 50 may be formed by manipulating the flexible substrate array 10 into a 'U' shape, with the light emitting diodes 124 facing the side 510, for example comprising the optic area 110 illustrated in FIG. 1.

Markings such as text or images can be printed upon the side 510 of the lighting fixture 50. Light from the light emitting diodes 124 can provide backlight for display of the markings Such markings can imprint information on light emitted by the fixture 50, for example to create an exit sign. In some example embodiments, the markings may be printed with an opaque ink or pigment and may be printed as an inverted or "mirror" image, depending upon the manner in which the flexible substrate array 10 will be manipulated.

Figure 6:
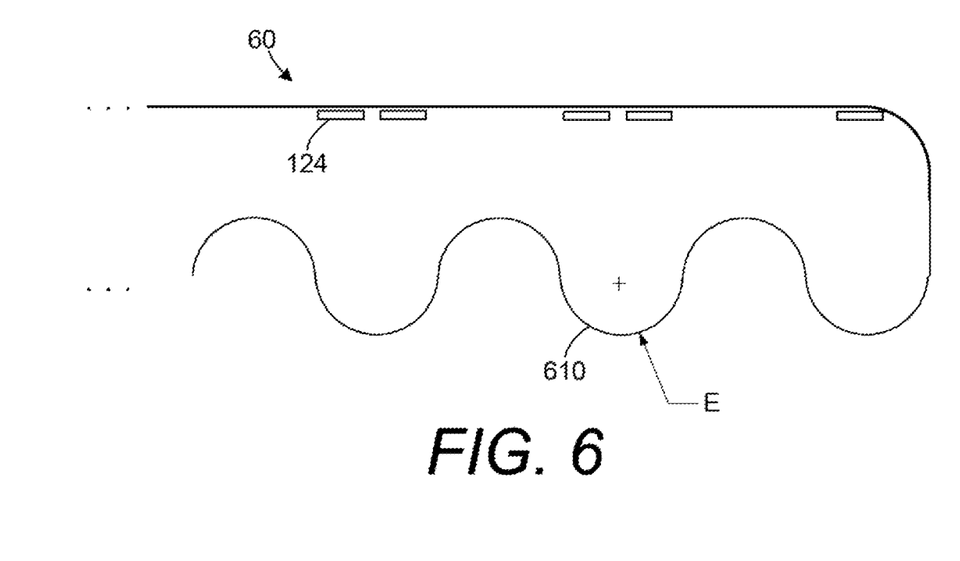
FIG. 6 is a cross-section view of a planar flexible substrate lighting fixture according to another example embodiment.

Turning now to FIG. 6, this figure provides a cross-section view of a planar flexible substrate lighting fixture 60 according to another example embodiment. The flexible substrate lighting fixture 60 illustrated in FIG. 6 can be produced from the flexible substrate array 20 illustrated in FIG. 2.

For example, the lighting fixture 60 may be formed by manipulating an optic area 210 of the flexible substrate array 20 into a wave shape having a series of semicircles 610. Each semicircle 610 can have a diameter "E." Light emitting diodes 124 face and illuminate the semicircles 610. The semicircles 610 may be formed in an optic area 210 created by expanding the flexible substrate array 20 in the X dimension without adding light emitting diodes in the expanded area, as discussed above with reference to FIG. 2.

Light from the light emitting diodes 124 can be diffused by the semicircles 610, and the semicircles 610 may appear visually as fluorescent bulbs.

The teaching provided herein supports numerous embodiments, some of which will now be further discussed, without limitation.

Example embodiments of a flexible diffuser lighting fixture are disclosed. The fixture can comprise a manipulated flexible substrate and an array of light emitting diodes (LEDs) coupled to the manipulated flexible substrate and positioned within an array area of the manipulated flexible substrate. The manipulated flexible substrate can be manipulated into a form that emits light from the array of LEDs through an optic area of the manipulated flexible substrate. The optic area can be integral with the manipulated flexible substrate and comprise optical features.

In some embodiments of the flexible diffuser lighting fixture, the array of LEDs is arranged into a plurality of spaced-apart rows of LEDs. In some embodiments of the flexible diffuser lighting fixture, the manipulated flexible substrate comprises text or an image printed on the optic area. In some embodiments of the flexible diffuser lighting fixture, the manipulated flexible substrate has a thickness within a range from 0.1 mm to 1.5 mm. In some embodiments of the flexible diffuser lighting fixture, the optical features refract the light emitted from the array of LEDs. In some embodiments of the flexible diffuser lighting fixture, the form of the manipulated flexible substrate comprises a radius of curvature within a range from one-quarter of an inch to three-quarters of an inch. In some embodiments of the flexible diffuser lighting fixture, the substrate is colored with a pigment or dye. In some embodiments of the flexible diffuser lighting fixture, the form of the manipulated flexible substrate has a cylindrical cross section. In some embodiments of the flexible diffuser lighting fixture, the form of the manipulated flexible substrate comprises a first cylindrical shape within a second cylindrical shape. In some embodiments of the flexible diffuser lighting fixture, the form of the manipulated flexible substrate is a 'U' shape.

Example embodiments of a light source are disclosed. The light source an comprise a continuous flexible substrate and an optic area. The continuous flexible substrate can comprise an array of light emitting diodes (LEDs) coupled to the continuous flexible substrate. The continuous flexible substrate can be formed such that light emitted from the array of LEDs passes through the optic area and exits the light source.

In some embodiments of the light source, the optic area comprises features that diffuse the light emitted from the array of LEDs. In some embodiments of the light source, the optic area comprises text or an image printed on a surface of the optic area. In some embodiments of the light source, the continuous flexible substrate has a thickness within a range from 0.1 mm to 1.5 mm. In some embodiments of the light source, the form of the continuous flexible substrate comprises a radius of curvature within a range from one-quarter of an inch to three-quarters of an inch. In some embodiments of the light source, the continuous flexible substrate is colored with a pigment or dye. In some embodiments of the light source, the form of the continuous flexible substrate has a cylindrical cross section. In some embodiments of the light source, the form of the continuous flexible substrate comprises a first cylindrical shape within a second cylindrical shape. In some embodiments of the light source, the form of the continuous flexible substrate is a 'U' shape.

Many modifications and other embodiments of the disclosures set forth herein will come to mind to one skilled in the art to which these disclosures pertain having the benefit of the teachings presented in the foregoing descriptions and the associated drawings. Therefore, it is to be understood that the disclosures are not to be limited to the specific embodiments disclosed and that modifications and other embodiments are intended to be included within the scope of this application. Although specific terms are employed herein, they are used in a generic and descriptive sense only and not for purposes of limitation.

What is claimed is:

1. A flexible diffuser lighting fixture, comprising:
    a manipulated flexible substrate; and
    an array of light emitting diodes (LEDs) coupled to the manipulated flexible substrate and positioned within an array area of the manipulated flexible substrate, wherein the manipulated flexible substrate is manipulated into a form that emits light from the array of LEDs through an optic area of the manipulated flexible substrate, wherein the optic area is integral with the manipulated flexible substrate and comprises optical features.

2. The flexible diffuser lighting fixture of claim 1, wherein the array of LEDs is arranged into a plurality of spaced-apart rows of LEDs.

3. The flexible diffuser lighting fixture of claim 1, wherein the manipulated flexible substrate comprises text or an image printed on the optic area.

4. The flexible diffuser lighting fixture of claim 1, wherein the manipulated flexible substrate has a thickness within a range from 0.1 mm to 1.5 mm.

5. The flexible diffuser lighting fixture of claim 1, wherein the optical features refract the light emitted from the array of LEDs.

6. The flexible diffuser lighting fixture of claim 1, wherein the form of the manipulated flexible substrate comprises a radius of curvature within a range from one-quarter of an inch to three-quarters of an inch.

7. The flexible diffuser lighting fixture of claim 1, wherein the substrate is colored with a pigment or dye.

8. The flexible diffuser lighting fixture of claim 1, wherein the form of the manipulated flexible substrate has a cylindrical cross section.

9. The flexible diffuser lighting fixture of claim 1, wherein the form of the manipulated flexible substrate comprises a first cylindrical shape within a second cylindrical shape.

10. The flexible diffuser lighting fixture of claim 1, wherein the form of the manipulated flexible substrate is a 'U' shape.

11. A light source comprising:
    a continuous flexible substrate, the continuous flexible substrate comprising:
        an array of light emitting diodes (LEDs) coupled to the continuous flexible substrate; and
        an optic area,
    wherein the continuous flexible substrate is formed such that light emitted from the array of LEDs passes through the optic area and exits the light source.

12. The light source of claim 11, wherein the optic area comprises features that diffuse the light emitted from the array of LEDs.

13. The light source of claim 11, wherein the optic area comprises text or an image printed on a surface of the optic area.

14. The light source of claim 11, wherein the continuous flexible substrate has a thickness within a range from 0.1 mm to 1.5 mm.

15. The light source of claim 11, wherein the form of the continuous flexible substrate comprises a radius of curvature within a range from one-quarter of an inch to three-quarters of an inch.

16. The light source of claim 11, wherein the continuous flexible substrate is colored with a pigment or dye.

17. The light source of claim 11, wherein the form of the continuous flexible substrate has a cylindrical cross section.

18. The light source of claim 11, wherein the form of the continuous flexible substrate comprises a first cylindrical shape within a second cylindrical shape.

19. The light source of claim 11, wherein the form of the continuous flexible substrate is a 'U' shape.

* * * * *